(12) United States Patent
Spanier et al.

(10) Patent No.: US 11,644,490 B2
(45) Date of Patent: May 9, 2023

(54) DIGITAL POWER METERING SYSTEM WITH SERIAL PERIPHERAL INTERFACE (SPI) MULTIMASTER COMMUNICATIONS

(71) Applicant: Electro Industries/GaugeTech, Westbury, NY (US)

(72) Inventors: Joseph Spanier, Brooklyn, NY (US); Hai Zhu, Westbury, NY (US)

(73) Assignee: EI Electronics LLC, Westbury, NY (US)

( * ) Notice: Subject to any disclaimer, the term of this patent is extended or adjusted under 35 U.S.C. 154(b) by 958 days.

(21) Appl. No.: 16/015,489

(22) Filed: Jun. 22, 2018

(65) Prior Publication Data

US 2019/0056437 A1  Feb. 21, 2019

Related U.S. Application Data

(63) Continuation of application No. 13/833,744, filed on Mar. 15, 2013, now abandoned, which is a
(Continued)

(51) Int. Cl.
*G01R 21/133* (2006.01)
*G01R 23/20* (2006.01)
(Continued)

(52) U.S. Cl.
CPC ........... *G01R 21/133* (2013.01); *G01R 22/10* (2013.01); *G01R 23/20* (2013.01); *G01R 19/2513* (2013.01); *G01R 35/005* (2013.01)

(58) Field of Classification Search
CPC ...... G01R 21/133; G01R 23/20; G01R 22/10; G01R 35/005; G01R 19/2513
(Continued)

(56) References Cited

U.S. PATENT DOCUMENTS 1,863,741 A   6/1932  Leon
2,292,163 A   8/1942  Shea
(Continued)

FOREIGN PATENT DOCUMENTS

JP    08247783       9/1996
WO    9854583 A1    12/1998
WO    0155733 A1    8/2001

OTHER PUBLICATIONS

European Standard EN-50160; "Voltage characteristics of electricity supplied by public distribution networks"; Copyright 2007 CENELEC; published Oct. 31, 2007; pp. 1-23.
(Continued)

*Primary Examiner* — John H Le
(74) *Attorney, Agent, or Firm* — Michael J Porco

(57) ABSTRACT

A digital power metering system with serial peripheral interface (SPI) multimaster communications is provided. A digital power meter is provided that includes at least one sensor that senses analog electrical parameters on electricity transmission lines from an electrical power distribution system, at least one analog-to-digital converter that receives the analog electrical parameters from the at least one sensor and converts the analog electrical parameters to sampled data; at least one processing device that performs calculations to determine power usage based on the sampled data and control overall operation of the meter, and a Serial Peripheral Interface (SPI), wherein the at least one processing device includes a plurality of processing devices, the SPI allowing one of the plurality of processing devices to become a master and the other processing devices of the plurality of processing devices to become slaves.

24 Claims, 8 Drawing Sheets

Related U.S. Application Data continuation-in-part of application No. 13/479,916, filed on May 24, 2012, now Pat. No. 8,700,347, which is a continuation of application No. 12/075,690, filed on Mar. 13, 2008, now Pat. No. 8,190,381, said application No. 13/833,744 is a continuation-in-part of application No. 13/447,346, filed on Apr. 16, 2012, now Pat. No. 8,862,435, which is a continuation of application No. 12/080,479, filed on Apr. 3, 2008, now Pat. No. 8,160,824.

(60) Provisional application No. 60/921,651, filed on Apr. 3, 2007.

(51) Int. Cl.
  *G01R 22/10* (2006.01)
  *G01R 35/00* (2006.01)
  *G01R 19/25* (2006.01)

(58) Field of Classification Search
  USPC ................................................. 702/62, 61
  See application file for complete search history.

(56) References Cited

U.S. PATENT DOCUMENTS

| | | |
|---|---|---|
| 2,435,753 A | 2/1948 | Walther et al. |
| 2,606,943 A | 8/1952 | Barker |
| 2,883,255 A | 4/1959 | Anderson |
| 2,900,605 A | 8/1959 | Squires et al. |
| 2,987,704 A | 6/1961 | Gimpel et al. |
| 2,992,365 A | 7/1961 | Brill |
| 3,084,863 A | 4/1963 | Du |
| 3,142,820 A | 7/1964 | Daniels |
| 3,166,726 A | 1/1965 | Jensen et al. |
| 3,205,439 A | 9/1965 | Michael et al. |
| 3,333,194 A | 7/1967 | Reynolds |
| 3,453,540 A | 7/1969 | Dusheck, Jr. |
| 3,458,810 A | 7/1969 | Wald |
| 3,467,864 A | 9/1969 | Plaats |
| 3,504,164 A | 3/1970 | Farrell et al. |
| 3,534,247 A | 10/1970 | Miljanic |
| 3,535,637 A | 10/1970 | Goransson |
| 3,629,852 A | 12/1971 | Thexton et al. |
| 3,737,891 A | 6/1973 | Metcalf |
| 3,815,013 A | 6/1974 | Milkovic |
| 3,824,441 A | 7/1974 | Heyman et al. |
| 3,995,210 A | 11/1976 | Milkovic |
| 4,066,960 A | 1/1978 | Milkovic |
| 4,077,061 A | 2/1978 | Johnston et al. |
| 4,140,952 A | 2/1979 | Miller |
| 4,158,810 A | 6/1979 | Leskovar |
| 4,182,983 A | 1/1980 | Heinrich et al. |
| 4,215,697 A | 8/1980 | Demetrescu |
| 4,240,149 A | 12/1980 | Fletcher et al. |
| 4,246,623 A | 1/1981 | Sun |
| 4,255,707 A | 3/1981 | Miller |
| 4,283,772 A | 8/1981 | Johnston |
| 4,336,736 A | 6/1982 | Mishima |
| 4,345,311 A | 8/1982 | Fielden |
| 4,360,879 A | 11/1982 | Cameron |
| 4,415,896 A | 11/1983 | Allgood |
| 4,437,059 A | 3/1984 | Hauptmann |
| 4,442,492 A | 4/1984 | Karlsson et al. |
| 4,463,311 A | 7/1984 | Kobayashi |
| 4,466,071 A | 8/1984 | Russell |
| 4,486,707 A | 12/1984 | Randall et al. |
| 4,495,463 A | 1/1985 | Milkovic |
| 4,608,533 A | 8/1986 | Starkie |
| 4,642,563 A | 2/1987 | McEachern et al. |
| 4,689,752 A | 8/1987 | Fernandes et al. |
| 4,709,339 A | 11/1987 | Fernandes |
| 4,713,608 A | 12/1987 | Catiller et al. |
| 4,713,609 A | 12/1987 | Losapio et al. |
| 4,742,296 A | 5/1988 | Petr et al. |
| 4,799,008 A | 1/1989 | Kannari |
| 4,804,957 A | 2/1989 | Selph et al. |
| 4,811,011 A | 3/1989 | Sollinger |
| 4,839,819 A | 6/1989 | Begin et al. |
| 4,841,236 A | 6/1989 | Miljanic et al. |
| 4,843,311 A | 6/1989 | Rozman et al. |
| 4,884,021 A | 11/1989 | Hammond et al. |
| 4,897,599 A | 1/1990 | Koslar |
| 4,902,965 A | 2/1990 | Bodrug et al. |
| 4,933,633 A | 6/1990 | Allgood |
| 4,949,029 A | 8/1990 | Cooper et al. |
| 4,958,294 A | 9/1990 | Herscher et al. |
| 4,958,640 A | 9/1990 | Logan |
| 4,979,122 A | 12/1990 | Davis et al. |
| 4,989,155 A | 1/1991 | Begin et al. |
| 4,996,646 A | 2/1991 | Farrington |
| 4,999,572 A | 3/1991 | Bickford et al. |
| 5,006,790 A | 4/1991 | Beverly et al. |
| 5,006,846 A | 4/1991 | Granville et al. |
| 5,014,229 A | 5/1991 | Mofachern |
| 5,017,860 A | 5/1991 | Germer et al. |
| 5,079,715 A | 1/1992 | Venkataraman et al. |
| 5,122,735 A | 6/1992 | Porter et al. |
| 5,132,609 A | 7/1992 | Nguyen |
| 5,132,610 A | 7/1992 | Ying-Chang |
| 5,166,887 A | 11/1992 | Farrington et al. |
| 5,170,115 A | 12/1992 | Kashiwabara et al. |
| 5,170,360 A | 12/1992 | Porter et al. |
| 5,185,705 A | 2/1993 | Farrington |
| 5,212,441 A | 5/1993 | McEachern et al. |
| 5,220,495 A | 6/1993 | Zulaski |
| 5,224,006 A | 6/1993 | MacKenzie et al. |
| 5,224,054 A | 6/1993 | Wallis |
| 5,229,713 A | 7/1993 | Bullock et al. |
| 5,233,538 A | 8/1993 | Wallis |
| 5,237,511 A | 8/1993 | Caird et al. |
| 5,243,536 A | 9/1993 | Bradford |
| 5,245,275 A | 9/1993 | Germer et al. |
| 5,248,935 A | 9/1993 | Sakoyama et al. |
| 5,248,967 A | 9/1993 | Daneshfar |
| 5,258,704 A | 11/1993 | Germer et al. |
| 5,289,115 A | 2/1994 | Germer et al. |
| 5,298,854 A | 3/1994 | McEachern et al. |
| 5,298,855 A | 3/1994 | McEachern et al. |
| 5,298,856 A | 3/1994 | McEachern et al. |
| 5,298,859 A | 3/1994 | McEachern et al. |
| 5,298,885 A | 3/1994 | McEachern et al. |
| 5,298,888 A | 3/1994 | McEachern et al. |
| 5,300,924 A | 4/1994 | McEachern et al. |
| 5,301,121 A | 4/1994 | Garverick et al. |
| 5,302,890 A | 4/1994 | McEachern et al. |
| 5,307,009 A | 4/1994 | McEachern et al. |
| 5,315,527 A | 5/1994 | Beckwith |
| 5,325,051 A | 6/1994 | Germer et al. |
| 5,343,143 A | 8/1994 | Voisine et al. |
| 5,347,464 A | 9/1994 | McEachern et al. |
| 5,391,983 A | 2/1995 | Lusignan et al. |
| 5,402,148 A | 3/1995 | Post et al. |
| 5,406,495 A | 4/1995 | Hill |
| 5,438,257 A | 8/1995 | Berkcan |
| 5,442,279 A | 8/1995 | Kitayoshi et al. |
| 5,450,007 A | 9/1995 | Payne et al. |
| 5,453,697 A | 9/1995 | Schweer et al. |
| 5,459,395 A | 10/1995 | Berkcan |
| 5,459,459 A | 10/1995 | Lee, Jr. |
| 5,475,628 A | 12/1995 | Adams et al. |
| 5,514,958 A | 5/1996 | Germer |
| 5,528,507 A | 6/1996 | McNamara et al. |
| 5,537,340 A | 7/1996 | Gawlik |
| 5,544,064 A | 8/1996 | Beckwith |
| 5,548,527 A | 8/1996 | Hemminger et al. |
| 5,555,508 A | 9/1996 | Munday et al. |
| 5,559,719 A | 9/1996 | Johnson et al. |
| 5,563,506 A | 10/1996 | Fielden et al. |
| 5,568,047 A | 10/1996 | Staver et al. |
| 5,574,654 A | 11/1996 | Bingham et al. |
| 5,581,173 A | 12/1996 | Yalla et al. |
| 5,592,165 A | 1/1997 | Jackson et al. |

(56) References Cited

U.S. PATENT DOCUMENTS

| | | | |
|---|---|---|---|
| 5,606,510 A | 2/1997 | Glaser et al. |
| 5,619,142 A | 4/1997 | Schweer et al. |
| 5,627,759 A | 5/1997 | Bearden et al. |
| 5,642,300 A | 6/1997 | Gubisch et al. |
| 5,650,936 A | 7/1997 | Loucks et al. |
| 5,675,754 A | 10/1997 | King et al. |
| 5,706,204 A | 1/1998 | Cox et al. |
| 5,706,214 A | 1/1998 | Putt et al. |
| 5,734,571 A | 3/1998 | Pilz et al. |
| 5,736,847 A | 4/1998 | Doorn et al. |
| 5,737,231 A | 4/1998 | Pyle et al. |
| 5,757,357 A | 5/1998 | Grande et al. |
| 5,758,331 A | 5/1998 | Johnson |
| 5,764,523 A | 6/1998 | Yoshinaga et al. |
| 5,768,632 A | 6/1998 | Husted et al. |
| 5,774,366 A | 6/1998 | Beckwith |
| 5,801,643 A | 9/1998 | Williams et al. |
| 5,819,203 A | 10/1998 | Moore et al. |
| 5,822,165 A | 10/1998 | Moran |
| 5,825,656 A | 10/1998 | Moore et al. |
| 5,828,576 A | 10/1998 | Loucks et al. |
| 5,832,210 A | 11/1998 | Akiyama et al. |
| 5,862,391 A | 1/1999 | Salas et al. |
| 5,874,903 A | 2/1999 | Shuey et al. |
| 5,890,097 A | 3/1999 | Cox |
| 5,892,758 A | 4/1999 | Argyroudis |
| 5,896,547 A | 4/1999 | Lee |
| 5,897,607 A | 4/1999 | Jenney et al. |
| 5,898,387 A | 4/1999 | Davis et al. |
| 5,899,960 A | 5/1999 | Moore et al. |
| 5,907,238 A | 5/1999 | Owerko et al. |
| 5,933,029 A | 8/1999 | Kuroda et al. |
| 5,952,819 A | 9/1999 | Berkcan et al. |
| 5,963,734 A | 10/1999 | Ackerman et al. |
| 5,978,655 A | 11/1999 | Ohura et al. |
| 5,986,574 A | 11/1999 | Colton |
| 5,994,892 A | 11/1999 | Turino et al. |
| 5,995,911 A | 11/1999 | Hart |
| 6,005,759 A | 12/1999 | Hart et al. |
| 6,011,519 A | 1/2000 | Sadler et al. |
| 6,018,690 A | 1/2000 | Saito et al. |
| 6,018,700 A | 1/2000 | Edel |
| 6,023,160 A | 2/2000 | Coburn |
| 6,032,109 A | 2/2000 | Ritmiller |
| 6,038,516 A | 3/2000 | Alexander et al. |
| 6,064,192 A | 5/2000 | Redmyer |
| 6,073,169 A | 6/2000 | Shuey et al. |
| 6,098,175 A | 8/2000 | Lee |
| 6,100,817 A | 8/2000 | Mason, Jr. et al. |
| 6,112,136 A | 8/2000 | Paul et al. |
| 6,133,720 A | 10/2000 | Elmore |
| 6,157,329 A | 12/2000 | Lee et al. |
| 6,163,243 A | 12/2000 | Titus |
| 6,167,329 A | 12/2000 | Engel et al. |
| 6,185,508 B1 | 2/2001 | Doorn et al. |
| 6,186,842 B1 | 2/2001 | Hirschbold et al. |
| 6,195,614 B1 | 2/2001 | Kochan |
| 6,262,672 B1 | 7/2001 | Brooksby et al. |
| 6,269,316 B1 | 7/2001 | Hubbard et al. |
| 6,289,267 B1 | 9/2001 | Alexander et al. |
| 6,292,717 B1 | 9/2001 | Alexander et al. |
| 6,363,057 B1 | 3/2002 | Ardalan et al. |
| 6,374,084 B1 | 4/2002 | Fok |
| 6,396,421 B1 | 5/2002 | Bland |
| 6,396,839 B1 | 5/2002 | Ardalan et al. |
| 6,397,155 B1 | 5/2002 | Przydatek et al. |
| 6,401,054 B1 | 6/2002 | Andersen |
| 6,415,244 B1 | 7/2002 | Dickens et al. |
| 6,417,661 B1 | 7/2002 | Berkcan et al. |
| 6,418,450 B2 | 7/2002 | Daudenarde |
| 6,423,960 B1 | 7/2002 | Engelhardt et al. |
| 6,429,637 B1 | 8/2002 | Gandhi |
| 6,429,785 B1 | 8/2002 | Griffin et al. |
| 6,433,981 B1 | 8/2002 | Fletcher et al. |
| 6,437,692 B1 | 8/2002 | Petite et al. |
| 6,444,971 B1 | 9/2002 | Engelhardt et al. |
| 6,479,976 B1 | 11/2002 | Edel |
| 6,483,291 B1 | 11/2002 | Bhateja et al. |
| 6,493,644 B1 | 12/2002 | Jonker et al. |
| 6,509,850 B1 | 1/2003 | Bland |
| 6,519,537 B1 | 2/2003 | Yang |
| 6,522,517 B1 | 2/2003 | Edel |
| 6,528,957 B1 | 3/2003 | Luchaco |
| 6,538,577 B1 | 3/2003 | Ehrke et al. |
| 6,542,838 B1 | 4/2003 | Haddad et al. |
| 6,590,380 B2 | 7/2003 | Edel |
| 6,611,773 B2 | 8/2003 | Przydatek et al. |
| 6,615,147 B1 | 9/2003 | Jonker et al. |
| 6,621,433 B1 | 9/2003 | Hertz |
| 6,636,030 B1 | 10/2003 | Rose et al. |
| 6,639,538 B1 | 10/2003 | Sechi et al. |
| 6,657,552 B2 | 12/2003 | Belski et al. |
| 6,661,357 B2 | 12/2003 | Bland |
| 6,671,635 B1 | 12/2003 | Forth et al. |
| 6,671,654 B1 | 12/2003 | Forth et al. |
| 6,671,802 B1 | 12/2003 | Ott |
| 6,674,379 B1 | 1/2004 | Li et al. |
| 6,675,071 B1 | 1/2004 | Griffin, Jr. et al. |
| 6,687,627 B1 | 2/2004 | Gunn et al. |
| 6,694,270 B2 | 2/2004 | Hart |
| 6,701,264 B2 | 3/2004 | Caso et al. |
| 6,714,881 B2 | 3/2004 | Carlson et al. |
| 6,717,394 B2 | 4/2004 | Elms |
| 6,735,535 B1 | 5/2004 | Kagan et al. |
| 6,745,138 B2 * | 6/2004 | Przydatek ............. H04L 9/3242 |
| | | 702/61 |
| 6,751,562 B1 | 6/2004 | Blackett et al. |
| 6,751,563 B2 | 6/2004 | Spanier et al. |
| 6,757,628 B1 | 6/2004 | Anderson et al. |
| 6,759,837 B2 | 7/2004 | Gandhi |
| 6,792,364 B2 | 9/2004 | Jonker et al. |
| 6,813,571 B2 * | 11/2004 | Lightbody ............. G01R 22/00 |
| | | 702/62 |
| 6,829,267 B2 | 12/2004 | Vaughan et al. |
| 6,836,737 B2 | 12/2004 | Petite et al. |
| 6,842,707 B2 | 1/2005 | Raichle et al. |
| 6,871,150 B2 * | 3/2005 | Huber ................... H04L 9/3242 |
| | | 702/62 |
| 6,900,738 B2 | 5/2005 | Crichlow |
| 6,917,888 B2 | 7/2005 | Logvinov et al. |
| 6,944,555 B2 | 9/2005 | Blackett et al. |
| 6,957,158 B1 | 10/2005 | Hancock et al. |
| 6,961,641 B1 | 11/2005 | Forth et al. |
| 6,963,195 B1 | 11/2005 | Berkcan |
| 6,985,087 B2 | 1/2006 | Soliman |
| 6,988,043 B1 | 1/2006 | Randall |
| 7,006,934 B2 | 2/2006 | Jonker et al. |
| 7,010,438 B2 | 3/2006 | Hancock et al. |
| 7,035,593 B2 | 4/2006 | Miller et al. |
| 7,043,459 B2 | 5/2006 | Peevey |
| 7,049,975 B2 | 5/2006 | Vanderah et al. |
| 7,050,808 B2 | 5/2006 | Janusz et al. |
| 7,050,916 B2 | 5/2006 | Curtis et al. |
| 7,072,779 B2 | 7/2006 | Hancock et al. |
| 7,085,824 B2 | 8/2006 | Forth et al. |
| 7,085,938 B1 | 8/2006 | Pozzuoli et al. |
| 7,126,439 B2 | 10/2006 | Qi et al. |
| 7,126,493 B2 | 10/2006 | Junker et al. |
| 7,174,261 B2 | 2/2007 | Gunn et al. |
| 7,191,076 B2 | 3/2007 | Huber et al. |
| 7,196,673 B2 | 3/2007 | Savage et al. |
| 7,209,804 B2 | 4/2007 | Curt et al. |
| 7,239,184 B2 | 7/2007 | Cetrulo et al. |
| 7,243,050 B2 | 7/2007 | Armstrong |
| 7,271,996 B2 | 9/2007 | Kagan et al. |
| 7,304,586 B2 | 12/2007 | Wang et al. |
| 7,304,829 B2 | 12/2007 | Nadipuram et al. |
| 7,305,310 B2 | 12/2007 | Slota et al. |
| 7,313,176 B1 | 12/2007 | Groen |
| 7,337,081 B1 | 2/2008 | Kagan |
| 7,342,507 B2 | 3/2008 | Jonker et al. |
| 7,359,809 B2 | 4/2008 | Bruno |
| 7,369,950 B2 | 5/2008 | Wall et al. |
| 7,372,574 B2 | 5/2008 | Sanders et al. |

(56) References Cited

U.S. PATENT DOCUMENTS

| | | |
|---|---|---|
| 7,409,303 B2 | 8/2008 | Yeo et al. |
| 7,436,687 B2 | 10/2008 | Patel |
| 7,444,454 B2 | 10/2008 | Yancey et al. |
| 7,511,468 B2 | 3/2009 | McEachern et al. |
| 7,514,907 B2 | 4/2009 | Rajda et al. |
| 7,554,320 B2 | 6/2009 | Kagan |
| 7,577,542 B2 | 8/2009 | Vacar et al. |
| 7,616,656 B2 | 11/2009 | Wang et al. |
| 7,630,863 B2 | 12/2009 | Zweigle et al. |
| 7,660,682 B2 | 2/2010 | Slota et al. |
| 7,761,910 B2 | 7/2010 | Ransom et al. |
| 7,765,127 B2 | 7/2010 | Banks et al. |
| 7,877,169 B2 | 1/2011 | Slota et al. |
| 7,881,907 B2 | 2/2011 | Curt et al. |
| 7,899,630 B2 | 3/2011 | Kagan |
| 7,916,060 B2 | 3/2011 | Zhu et al. |
| 7,920,976 B2 | 4/2011 | Banhegyesi |
| 7,962,298 B2 | 6/2011 | Przydatek et al. |
| 7,974,713 B2 | 7/2011 | Disch et al. |
| 7,996,171 B2 | 8/2011 | Banhegyesi |
| 7,999,696 B2 | 8/2011 | Wang et al. |
| 8,022,690 B2 | 9/2011 | Kagan |
| 8,063,704 B2 | 11/2011 | Wu et al. |
| 8,073,642 B2 | 12/2011 | Slota et al. |
| 8,078,418 B2 | 12/2011 | Banhegyesi et al. |
| 8,107,491 B2 | 1/2012 | Wang et al. |
| 8,121,801 B2 | 2/2012 | Spanier et al. |
| 8,160,824 B2 | 4/2012 | Spanier et al. |
| 8,190,381 B2 | 5/2012 | Spanier et al. |
| 8,269,482 B2 | 9/2012 | Banhegyesi |
| 8,442,660 B2 | 5/2013 | Kagan |
| 8,515,348 B2 | 8/2013 | Kagan |
| 8,599,036 B2 | 12/2013 | Wang et al. |
| 8,620,608 B2 | 12/2013 | Banhegyesi et al. |
| 8,666,688 B2 | 3/2014 | Spanier et al. |
| 8,700,347 B2 | 4/2014 | Spanier et al. |
| 8,797,202 B2 | 8/2014 | Zhu et al. |
| 8,862,435 B2 | 10/2014 | Spanier et al. |
| 8,878,517 B2 | 11/2014 | Banhegyesi |
| 8,930,153 B2 | 1/2015 | Kagan et al. |
| 8,933,815 B2 | 1/2015 | Kagan et al. |
| 9,080,894 B2 | 7/2015 | Spanier et al. |
| 9,092,593 B2 | 7/2015 | Nasle |
| 9,194,898 B2 | 11/2015 | Banhegyesi et al. |
| 9,482,555 B2 | 11/2016 | Spanier et al. |
| 9,897,665 B2 | 2/2018 | Taft |
| 9,903,895 B2 | 2/2018 | Banhegyesi et al. |
| 9,989,618 B2 | 6/2018 | Spanier et al. |
| 2001/0038343 A1 | 11/2001 | Meyer et al. |
| 2002/0018399 A1 | 2/2002 | Schultz et al. |
| 2002/0032535 A1 | 3/2002 | Alexander et al. |
| 2002/0091784 A1 | 7/2002 | Baker et al. |
| 2002/0105435 A1 | 8/2002 | Yee et al. |
| 2002/0109608 A1 | 8/2002 | Petite et al. |
| 2002/0120723 A1 | 8/2002 | Forth et al. |
| 2002/0129342 A1 | 9/2002 | Kil et al. |
| 2002/0169570 A1 | 11/2002 | Spanier et al. |
| 2002/0180420 A1 | 12/2002 | Lavoie et al. |
| 2003/0014200 A1 | 1/2003 | Jonker et al. |
| 2003/0018982 A1 | 1/2003 | Zeidler et al. |
| 2003/0025620 A1 | 2/2003 | Bland |
| 2003/0065459 A1* | 4/2003 | Huber .................. H04L 9/3271 702/62 |
| 2003/0076247 A1 | 4/2003 | Bland |
| 2003/0093429 A1 | 5/2003 | Nishikawa et al. |
| 2003/0154471 A1 | 8/2003 | Teachman et al. |
| 2003/0178982 A1 | 9/2003 | Elms |
| 2003/0178985 A1 | 9/2003 | Briese et al. |
| 2003/0187550 A1 | 10/2003 | Wilson et al. |
| 2003/0204756 A1 | 10/2003 | Ransom et al. |
| 2003/0226058 A1 | 12/2003 | Miller et al. |
| 2004/0113810 A1 | 6/2004 | Mason et al. |
| 2004/0122833 A1 | 6/2004 | Forth et al. |
| 2004/0128260 A1 | 7/2004 | Amedure et al. |
| 2004/0138835 A1 | 7/2004 | Ransom et al. |
| 2004/0167686 A1 | 8/2004 | Baker et al. |
| 2004/0172207 A1 | 9/2004 | Hancock et al. |
| 2004/0177062 A1 | 9/2004 | Urquhart et al. |
| 2004/0183522 A1 | 9/2004 | Gunn et al. |
| 2004/0193329 A1 | 9/2004 | Ransom et al. |
| 2004/0208182 A1 | 10/2004 | Boles et al. |
| 2005/0027464 A1 | 2/2005 | Jonker et al. |
| 2005/0060110 A1 | 3/2005 | Jones et al. |
| 2005/0071106 A1 | 3/2005 | Huber et al. |
| 2005/0093571 A1 | 5/2005 | Suaris et al. |
| 2005/0144437 A1 | 6/2005 | Ransom et al. |
| 2005/0165585 A1 | 7/2005 | Bhateja et al. |
| 2005/0187725 A1 | 8/2005 | Cox |
| 2005/0220079 A1 | 10/2005 | Asokan |
| 2005/0240362 A1 | 10/2005 | Randall |
| 2005/0243204 A1 | 11/2005 | Zhu |
| 2005/0273280 A1 | 12/2005 | Cox |
| 2005/0288876 A1 | 12/2005 | Doig et al. |
| 2006/0047787 A1 | 3/2006 | Agarwal et al. |
| 2006/0052958 A1 | 3/2006 | Hancock et al. |
| 2006/0066456 A1 | 3/2006 | Jonker et al. |
| 2006/0066903 A1 | 3/2006 | Shiimori |
| 2006/0083260 A1 | 4/2006 | Wang et al. |
| 2006/0085419 A1 | 4/2006 | Rosen |
| 2006/0095219 A1 | 5/2006 | Bruno |
| 2006/0145890 A1 | 7/2006 | Junker et al. |
| 2006/0161360 A1 | 7/2006 | Yao et al. |
| 2006/0200599 A1 | 9/2006 | Manchester et al. |
| 2006/0261296 A1* | 11/2006 | Heath .................. A61B 6/4494 250/580 |
| 2006/0267560 A1 | 11/2006 | Rajda et al. |
| 2007/0058320 A1 | 3/2007 | Lee |
| 2007/0058634 A1 | 3/2007 | Gupta et al. |
| 2007/0067119 A1 | 3/2007 | Loewen et al. |
| 2007/0067121 A1 | 3/2007 | Przydatek et al. |
| 2007/0081597 A1 | 4/2007 | Disch et al. |
| 2007/0096765 A1 | 5/2007 | Kagan |
| 2007/0096942 A1 | 5/2007 | Kagan et al. |
| 2007/0112446 A1 | 5/2007 | Deveaux et al. |
| 2007/0114987 A1 | 5/2007 | Kagan |
| 2007/0152058 A1 | 7/2007 | Yeakley et al. |
| 2007/0233323 A1 | 10/2007 | Wiemeyer et al. |
| 2008/0075194 A1 | 3/2008 | Ravi et al. |
| 2008/0086222 A1 | 4/2008 | Kagan |
| 2008/0091770 A1 | 4/2008 | Petras et al. |
| 2008/0147334 A1 | 6/2008 | Kagan |
| 2008/0172192 A1 | 7/2008 | Banhegyesi |
| 2008/0195794 A1 | 8/2008 | Banker |
| 2008/0215264 A1 | 9/2008 | Spanier et al. |
| 2008/0234957 A1 | 9/2008 | Banhegyesi et al. |
| 2008/0235355 A1 | 9/2008 | Spanier et al. |
| 2008/0238406 A1 | 10/2008 | Banhegyesi |
| 2008/0238713 A1 | 10/2008 | Banhegyesi et al. |
| 2008/0252481 A1 | 10/2008 | Vacar et al. |
| 2008/0255782 A1 | 10/2008 | Bilac et al. |
| 2009/0012728 A1 | 1/2009 | Spanier et al. |
| 2009/0066528 A1 | 3/2009 | Bickel et al. |
| 2009/0072813 A1 | 3/2009 | Banhegyesi |
| 2009/0096654 A1 | 4/2009 | Zhu et al. |
| 2009/0228224 A1 | 9/2009 | Spanier et al. |
| 2009/0265124 A1 | 10/2009 | Kagan |
| 2010/0054276 A1 | 3/2010 | Wang et al. |
| 2010/0076616 A1* | 3/2010 | Kagan .................. G06F 13/102 700/295 |
| 2010/0082844 A1 | 4/2010 | Stoupis et al. |
| 2010/0153036 A1 | 6/2010 | Elwarry et al. |
| 2010/0169876 A1 | 7/2010 | Mann |
| 2010/0324845 A1 | 12/2010 | Spanier et al. |
| 2011/0040809 A1 | 2/2011 | Spanier et al. |
| 2011/0153697 A1 | 6/2011 | Nickolov et al. |
| 2011/0158244 A1 | 6/2011 | Long et al. |
| 2011/0260710 A1 | 10/2011 | Zhu et al. |
| 2011/0270551 A1 | 11/2011 | Kagan et al. |
| 2012/0025807 A1 | 2/2012 | Banhegyesi |
| 2012/0131100 A1 | 5/2012 | Olst et al. |
| 2012/0209057 A1 | 8/2012 | Siess et al. |
| 2012/0209552 A1 | 8/2012 | Spanier et al. |
| 2012/0209557 A1 | 8/2012 | Crandall et al. |
| 2013/0158918 A1 | 6/2013 | Spanier et al. |

(56) References Cited

U.S. PATENT DOCUMENTS

| | | | |
|---|---|---|---|
| 2014/0180613 A1 | 6/2014 | Banhegyesi et al. | |
| 2014/0222357 A1 | 8/2014 | Spanier et al. | |
| 2017/0046458 A1 | 2/2017 | Meagher et al. | |

OTHER PUBLICATIONS

International Standard IEC-61000-4-7, Second Edition; "Electromagnetic compatibility (EMC)—Part 4-7:Testing and measurement techniques"; Copyright Commission Electrotechnique Commission 2002; Geneva, Switzerland; pp. 1-80.

ION Technology, 7500 ION 7600 ION High Visibility Energy & Power Quality Compliance Meters, Power Measurement, specification, pp. 1-8, revision date Nov. 30, 2000.

International Standard IEC-687, Second Edition; "Alternating current static watt-hours meters for active energy"; Copyright Commission Electrotechnique Commission 1992; Geneva, Switzerland; pp. 1-36.

"Power Quality—A guide to voltage fluctuation and light flicker"; BChydro Power Smart, Vancouver, B.C., Canada; Dated Mar. 2005; pp. 1-12.

3720 ACM, 3-hase Power Instruction Package, Power Measurement, specification, 8 pages, revision date Dec. 16, 1998.

3720 ACM, Installation & Operation Manual, Power Measurement, 67 pages, revision date Apr. 4, 2000.

6200 ION, Installation & Basic Setup Instructions, (c)Power Measurement Ltd., Revision Date Apr. 25, 2001, 50 pages.

8400 ION/8500 ION Instruction Leaflet, Power Measurement, pp. 1-8, Oct. 1999.

8500 ION Technical Documentation, 8500 ION and 8500 ION-PQ Advanced Intelligent Billing Meters, specification, Power Measurement, revision date Apr. 15, 1999.

Braden, R (editor), "Requirements for Internet Hosts-Application and Support", RFC 1123, pp. 1-97Oct. 1989.

Brochure, Sentinel TM Electronic "Multimeasurement Meter," Schlumberger, Mar. 2001, 4 pages.

Communicator EXT 3.0 User Manual Revision 1.32, Electro Industries/Gauge Tech, 558 pages, Aug. 27, 2007.

Deutsch, P., Emtage, A., and Marine, A., "How to Use Anonymous FTP", RFC1635, pp. 1-13, May 1994.

Futura+Series, "Advanced Power Monitoring and Analysis for the 21st Century", Electro Industries/Gauge Tech, specification, 8 pages, Apr. 13, 2000.

http://www.landisgyr.us/Landis_Gyr/Meters/2510_socket_meter. asp, Apr. 18, 2005, 25 pages.

Hubbert, "What is flat file?", WhatIs.com,http://searchsqlserver. techtarget.com/definition/flat-file, Jul. 2006, 1pp.

IEC 61000-4-15: Electromagnetic compatibility (EMC) Part 4: Testing and measuring techniques, Section 15: Flickermeter— Functional and design specifications; CENELEC—European Committee for Electrotechnical Standardization; Apr. 1998.

IEEE Std 1159-1995; IEEE Recommended Practice for monitoring Electric Power Quality; Copyright the Institute of Electrical and Electronics Engineers, Inc. 1995; New York, NY; pp. 1-76.

IEEE Std 519-1992; IEEE Recommended Practices and Requirements for Harmonic Control in Electrical Power Systems; Copyright the Institute of Electrical and Electronics Engineers, Inc. 1993; New York, NY; pp. 1-101.

International Standard IEC-1180-1; "High-voltage test techniques for low-voltage equipment"; Copyright Commission Electrotechnique Commission 1992; Geneva, Switzerland; pp. 1-62.

International Standard IEC-61000-2-4, Second Edition; "Electromagnetic compatibility (EMC)—Part 2-4:Environment-Compatibility levels in industrial plants for low-frequency conducted disturbances"; Copyright Commission Electrotechnique Commission 2002; GenevaSwitzerland; pp. 1-84.

International Standard IEC-61000-4-30, First Edition; "Electromagnetic compatibility (EMC)—Part 4-30:Testing and measurement techniques-Power quality measurement methods"; Copyright Commission Electrotechnique Commission 2003; Geneva, Switzerland; pp. 1-98.

ION 7550/ION7650 User Guide Power Measurement—Revision Date Aug. 31, 2004.

ION Technology 7700 ION 3—Phase Power Meter, Analyzer and Controller, Power Measurement, specification, pp. 1-10, revision date Dec. 8, 1998.

ION Technology 7700 ION Installation & Operation Manual, Power Measurement, revision date Nov. 20, 1996.

Ion Technology 8500 ION. 8400 ION Advanced Socket-Mount Meter, specification, Power Measurement, pp. 1-12, revision date Dec. 3, 1999.

ION Technology, 7500 ION High Visibility 3—Phase Energy & Power Quality Meter, Power Measurement, specification, pp. 1-8, revision date Mar. 21, 2000.

ION(R) Technology, Meter Shop User's Guide, (C)Power Measurement Ltd., Revision DAte May 10, 2001, 48 pages.

ION7550/ion7650 PowerLogic power-monitoring units, Technical data sheets, pp. 1-12, Copyright 2006 Schneider Electric.

Manual, "3300 ACM, Economical Digital Power Meter/Transducer—Installation and Operation Manual, Power Measurement, Ltd.", 1999, pp. 79.

Nagura et al., "Correction method for a single chip power meter", May 10-12, 1994, IEEE, 1994 IEEE Instrumentation and Measurement Technology Conference, 1994. ITMC/94.

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure Technology, Electro Industries/Gauge Tech, specification, 16 pages, Nov. 1999.

Nexus 1250/1252 Installation and Operation Manual Revision 1.31, Electro Industries/Gauge Tech, 146 pages, Jan. 212010.

Nexus 1500 Installation and Operation Manual Revision 1.03, Electro Industries/Gauge Tech, 124 pages, Jan. 42010.

Performance Power Meter & Data Acquisition Node, Electro Industries/Gauge Tech, Nexus 1250 specification, 8 pages, Dec. 14, 2000.

Postel, J.B., and Reynolds, J.K. "File Transfer Protocol (FTP)", RFC959, pp. 1-66, Oct. 1985.

Power Platform 4300 Multi-DAQ TASKCard Operator's Manual; Dranetz-BMI, Original Issue—Jul. 2002, pp. 203.

Power Platform PP1 &PP1E TASKCard-Inrush Operator's Manual; Dranetz-BMI, Revision A—Apr. 15, 1997, pp. 231.

PowerLogic Series 4000 Circuit Monitors, pp. 1-4; Document #3020HO0601; Jan. 2006.

Ramboz, J.D. and Petersons, O., Nist Measurement Services: A Calibration Service for Current Transformers, U.S. Dept. of Commerce, National Institute of Standards and Tech., U.S. Gov. PMtg. Ofc., Jun. 1991.

Series 5500 InfoNode User's Gide; Dranetz-BMI, Edison, NJ; Copywright 1999, 2002, 2004; pp. 1-220.

Speirs, "What is binary file?", WhatIs.com, http://whatis.techtarget. com/definition/binary-file, Apr. 2005, 1 pp.

The Dranetz Field Handbook for Power quality Analysis; Dranetz Technologies Incorporated, Edison, NJ; Copyright 1991; pp. 1-271.

User's Installation & Operation and User's Programming Manual. The Futura Series, Electro Industries, pp. 1-64, Copyright 1995.

Zeinalipour-Yazti et ai, MicroHash: An Efficient Index Structure for Flash-Based Sensor Devices, Proceedings of the 4th Conference on USENIX Conference on File and Storage Technologies, vol. 4, Dec. 2005, pp. 14.

Electro Industries/Gauge Tech DM Series—specification brochure, "DMMS 425 Low-Cost Multifunction Power Monitoring Outperforms All Others in its Class", 4 pages; Dec. 21, 2000.

\* cited by examiner

DIGITAL POWER METERING SYSTEM WITH SERIAL PERIPHERAL INTERFACE (SPI) MULTIMASTER COMMUNICATIONS

PRIORITY

This application is a continuation application of U.S. patent application Ser. No. 13/833,744 filed on Mar. 15, 2013, now abandoned, which is a continuation-in-part application of U.S. patent application Ser. No. 13/479,916 filed on May 24, 2012, now U.S. Pat. No. 8,700,347, which is a continuation application of U.S. patent application Ser. No. 12/075,690 filed on Mar. 13, 2008, now U.S. Pat. No. 8,190,381, which claims priority to U.S. Provisional Patent Application Ser. No. 60/921,651 filed Apr. 3, 2007, the contents of all of which are hereby incorporated by reference in their entireties.

This application is also a continuation-in-part application of U.S. patent application Ser. No. 13/447,346 filed on Apr. 16, 2012, now U.S. Pat. No. 8,862,435, which is a continuation application of U.S. patent application Ser. No. 12/080,479 filed on Apr. 3, 2008, now U.S. Pat. No. 8,160,824, which claims priority to U.S. Provisional Patent Application Ser. No. 60/921,651 filed Apr. 3, 2007, the contents of all of which are hereby incorporated by reference in their entireties.

BACKGROUND

Field

The present disclosure relates to the field of power quality monitoring and control, and more particularly to identify frequencies in a power signal.

Description of the Related Art

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be intelligent electronic devices ("IED"). Intelligent electronic devices typically include some form of a processor. In general, the processor is capable of using the measured voltage and current to derive the measurement parameters. The processor operates based on a software configuration. A typical consumer or supplier of electrical energy may have many intelligent electronic devices (IEDs) installed and operating throughout their operations. IEDs may be positioned along the supplier's distribution path or within a customer's internal distribution system. IEDs include revenue electric watt-hour meters, protection relays, programmable logic controllers, remote terminal units, fault recorders and other devices used to monitor and/or control electrical power distribution and consumption. IEDs are widely available that make use of memory and microprocessors to provide increased versatility and additional functionality. Such functionality includes the ability to communicate with remote computing systems, either via a direct connection, e.g. modem or via a network. IEDs also include legacy mechanical or electromechanical devices that have been retrofitted with appropriate hardware and/or software allowing integration with the power management system.

Typically, an IED is associated with a particular load or set of loads that are drawing electrical power from the power distribution system. The IED may also be capable of receiving data from or controlling its associated load. Depending on the type of IED and the type of load it may be associated with, the IED implements a power management function that is able to respond to a power management command and/or generate power management data. Power management functions include measuring power consumption, controlling power distribution such as a relay function, monitoring power quality, measuring power parameters such as phasor components, voltage or current, controlling power generation facilities, computing revenue, controlling electrical power flow and load shedding, or combinations thereof.

SUMMARY

In accordance with embodiments of the present disclosure, there are provided herein methods and systems for identifying the frequencies present in a power signal.

In one aspect, a method for identifying frequencies present in a power signal includes steps of digitally sampling sensor data yielding digital sampled data; performing a calibration on the digital sampled data yielding calibrated digital sampled data; filtering the calibrated digital sampled data to yield calibrated and filtered sampled data; detecting n consecutive zero-crossing events in the calibrated and filtered sampled data; identifying all calibrated digital sampled data points in the range between the first zero-crossing event and the nth zero-crossing event; and storing all of the identified calibrated digital sampled data points; resampling the stored calibrated sampled data points yielding a set of resampled calibrated sampled data points.

The present disclosure provides for overcoming the problem of errors which occur when sampling a signal and performing a transformation from the time domain to the frequency domain.

BRIEF DESCRIPTION OF THE DRAWINGS

These and other objects, features and advantages of the present disclosure will be apparent from a consideration of the following Detailed Description considered in conjunction with the drawing Figures, in which.

DETAILED DESCRIPTION

Preferred embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In a preferred embodiment, however, the functions are performed by at least one processor, such as a computer or an electronic data processor, digital signal processor or embedded micro-controller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links. Several inventive embodiments of the present disclosure are described below.

Preferred embodiments of the present disclosure will be described herein below with reference to the accompanying drawings.

As used herein, intelligent electronic devices ("IEDs") include Programmable Logic Controllers ("PLCs"), Remote Terminal Units ("RTUs"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

Figure 1:
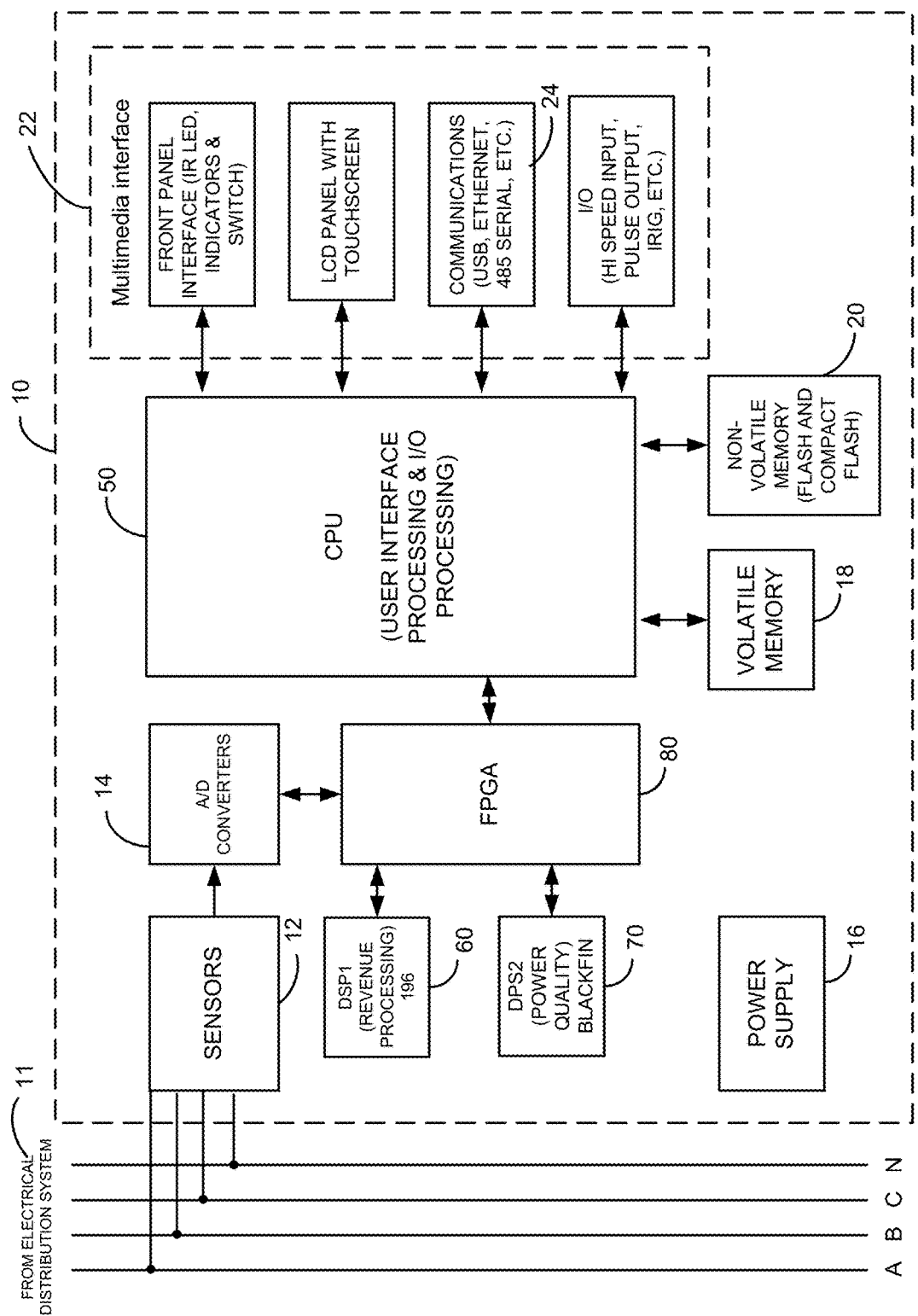
FIG. 1 is a block diagram of an intelligent electronic device (IED), according to an embodiment of the present disclosure.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 10 of FIG. 1 includes a plurality of sensors 12 coupled to various phases A, B, C and neutral N of an electrical distribution system 11, a plurality of analog-to-digital (A/D) converters 14, including inputs coupled to the sensor 12 outputs, a power supply 16, a volatile memory 18, a non-volatile memory 20, a multimedia user interface 22, and a processing system that includes at least one central processing unit (CPU) 50 (or host processor) and one or more digital signal processors, two of which are shown, i.e., DSP1 60 and DSP2 70. The IED 10 also includes a Field Programmable Gate Array 80 which performs a number of functions, including, but not limited to, acting as a communications gateway for routing data between the various processors 50, 60, 70, receiving data from the A/D converters 14, performing transient detection and capture and performing memory decoding for CPU 50 and the DSP processor 60. In one embodiment, the FPGA 80 is internally comprised of two dual port memories to facilitate the various functions.

The plurality of sensors 12 sense electrical parameters, e.g., voltage and current, on incoming lines, (i.e., phase A, phase B, phase C, neutral N), from an electrical power distribution system 11. The sensors 12 will sense electrical parameters, e.g., voltage and current, of the incoming lines from an electrical power distribution system 11, e.g., an electrical circuit. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 50, DSP1 60, DSP2 70, FPGA 80 or any combination thereof.

A/D converters 14 are respectively configured to convert an analog voltage output to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 14 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 80. In some embodiments, the digital samples, which are output from the A/D converters 14 are sent directly to the CPU 50 or DSP processors 60, 70, effectively bypassing the FPGA 80 as a communications gateway.

The power supply 16 provides power to each component of the IED 10. Preferably, the power supply 16 is a transformer with its primary windings coupled to the incoming power distribution lines and having windings to provide a nominal voltage, e.g., 5 VDC, +12 VDC and −12 VDC, at its secondary windings. In other embodiments, power may be supplied from an independent power source to the power supply 16. For example, power may be supplied from a different electrical circuit or an uninterruptible power supply (UPS).

In one embodiment, the power supply 16 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 22 is shown coupled to the CPU 50 in FIG. 1 for interacting with a user and for communicating events, such as alarms and instructions to the user. The multimedia user interface 22 preferably includes a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 22 further includes a speaker or audible output means for audibly producing instructions, alarms, data, etc. The speaker is coupled to the CPU 50 via a digital-to-analog converter (D/A) for converting digital audio files stored in a memory 18 or non-volatile memory 20 to analog signals playable by the speaker. An exemplary interface is disclosed and described in commonly owned pending U.S. application Ser. No. 11/589,381, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 10 will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

The IED 10 further comprises a volatile memory 18 and a non-volatile memory 20. In addition to storing audio and/or video files, volatile memory 19 will store the sensed and generated data for further processing and for retrieval when called upon to be displayed at the IED 10 or from a remote location. The volatile memory 18 includes internal storage memory, e.g., random access memory (RAM), and the non-volatile memory 20 includes removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including timestamps and stored digital samples for later downloading to a client application, web-server or PC application.

In a further embodiment, the IED 10 will include a communication device 24, also know as a network interface, for enabling communications between the IED or meter, and a remote terminal unit, programmable logic controller and other computing devices, microprocessors, a desktop computer, laptop computer, other meter modules, etc. The communication device 24 may be a modem, network interface card (NIC), wireless transceiver, etc. The communication device 24 will perform its functionality by hardwired and/or wireless connectivity. The hardwire connection may include but is not limited to hard wire cabling e.g., parallel or serial cables, RS232, RS485, USB cable, Firewire (1394 connectivity) cables, Ethernet, and the appropriate communication port configuration. The wireless connection will operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee, WiFi, or any mesh enabled wireless communication.

The IED 10 may communicate to a server or other computing device via a communication device 24. The IED 10 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, etc., the details of which will be described in detail below.

In an additional embodiment, the IED 10 will also have the capability of not only digitizing waveforms, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data in response to a polled request. The digitized waveform will also allow the CPU 50 to compute other electrical parameters such as harmonics, magnitudes, symmetrical components and phasor analysis. Using the harmonics, the IED 10 will also calculate dangerous heating conditions and can provide harmonic transformer derating based on harmonics found in the current waveform.

In a further embodiment, the IED 10 will execute an e-mail client and will send e-mails to the utility or to the customer direct on an occasion that a power quality event occurs. This allows utility companies to dispatch crews to repair the condition. The data generated by the meters, or IEDs, are use to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is available in U.S. Pat. No. 6,751,563, which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that will trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Furthermore, it is to be appreciated that the IEDs or meters described herein may take many form factors, such as a panel meter, revenue meters, socket meter, etc. Exemplary housings and form factors are disclosed in commonly owned and co-pending U.S. application Ser. No. 13/792,616, the contents of which are hereby incorporated by reference in its entirety.

Methods for identifying harmonic and inter-harmonic information in a power signal will now be described.

Figure 4:
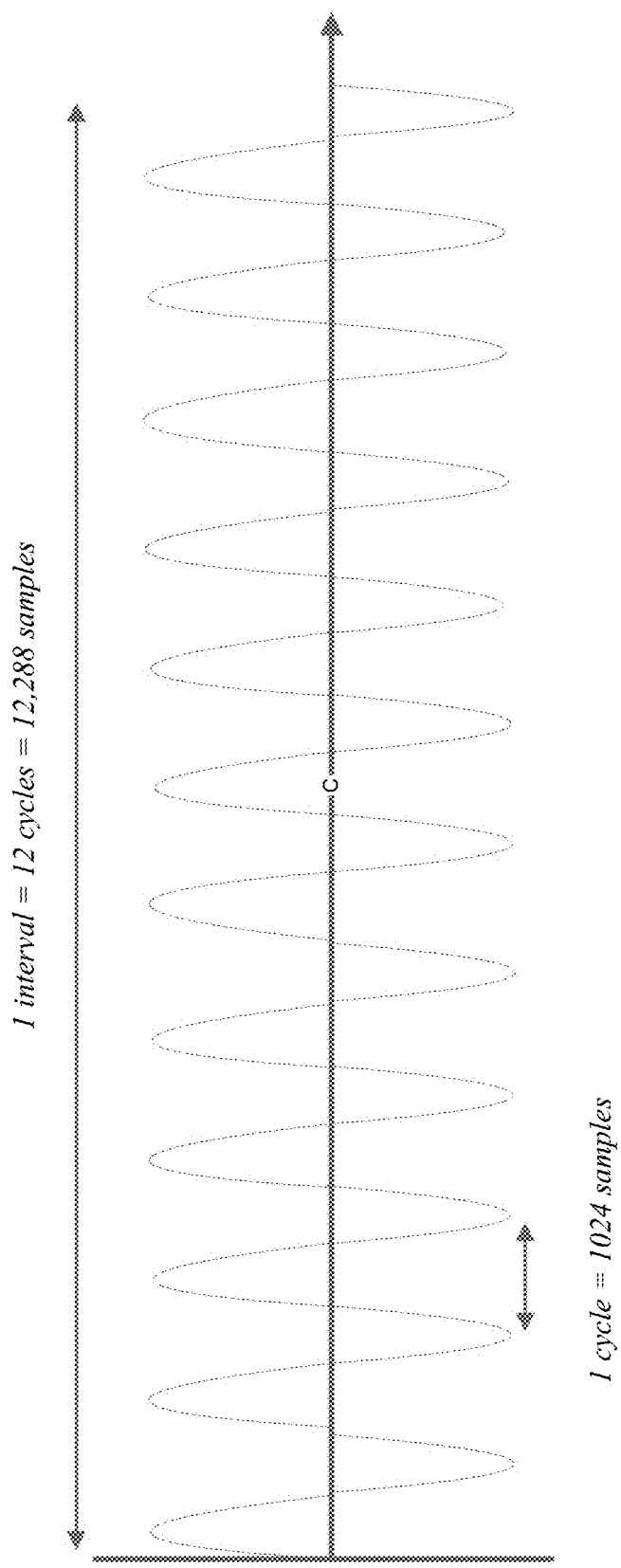
FIG. 4 illustrates an interval, for a 60 Hz system comprising 12 consecutive cycles of sampled digital data output from A/D converters.

In one embodiment, for a 60 Hz system, the method operates on an interval basis, as illustrated in FIG. 4, with an interval defined as 12 consecutive cycles of sampled digital data output from the A/D converters 14. In other embodiments, the number of cycles that defines an interval may be any positive integer greater than 2. For example, for a 50 Hz system, a preferred number of cycles is 10. Thus, in each 12 cycle interval comprising 12 cycles, a total of 12,288 digital samples are obtained with 1024 samples per cycle. The 12,288 samples are processed in accordance with the method embodiment described in FIGS. 2a and 2b.

Figure 3:
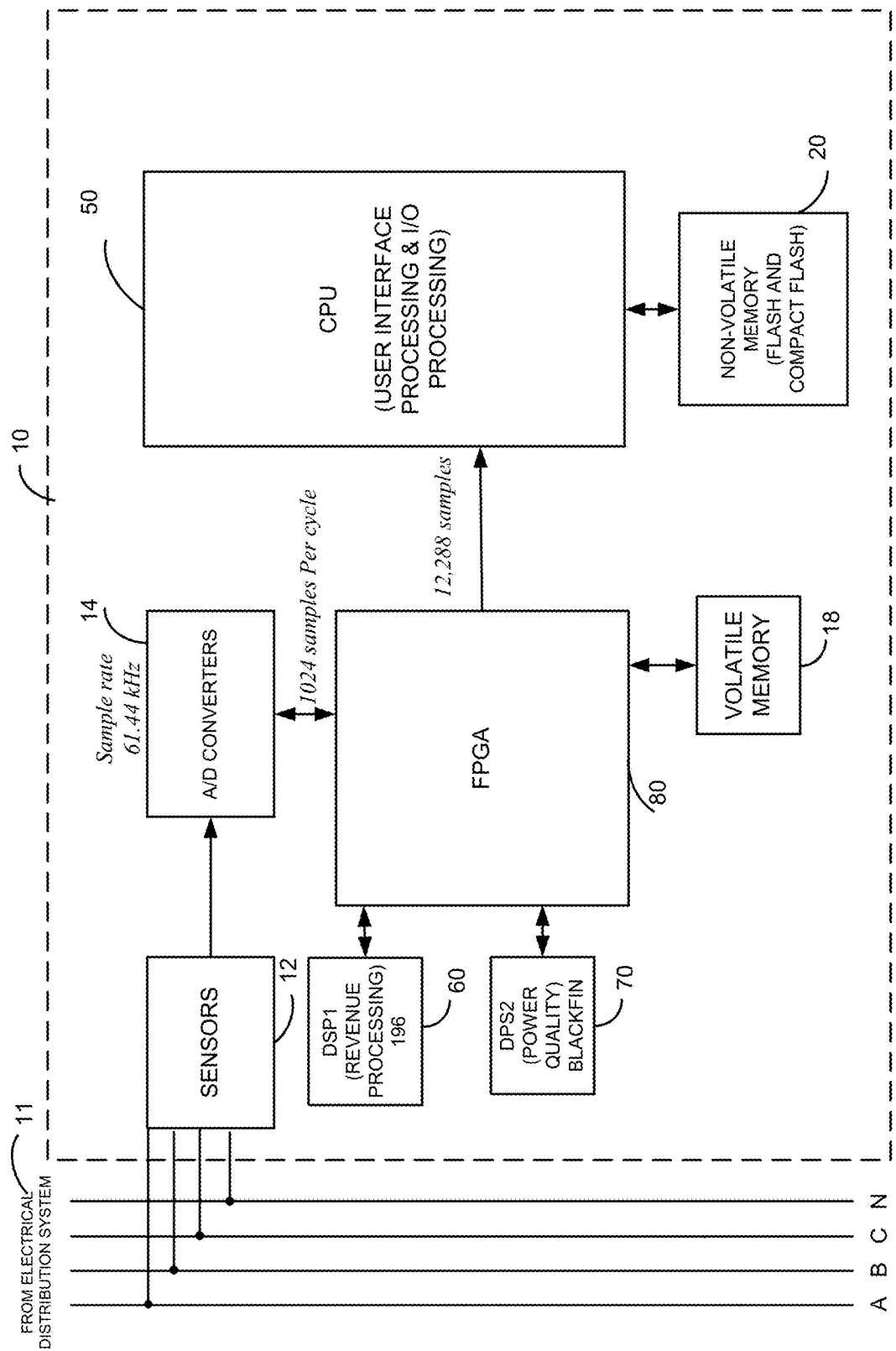
FIG. 3 illustrates the data flow associated with those components of FIG. 1 which are used in accordance with a method according to a 60 Hz embodiment.

FIG. 3 illustrates the data flow associated with those components of FIG. 1 which are used in accordance with a method according to a 60 Hz embodiment. With a 60 Hz declared system setup, in each 12 cycle interval, due to variations in frequency above and below an idealized 60 Hz system, an unknown number of digital samples are obtained in each interval, substantially in the range of X=10,530 to 17,350 samples per interval. Due to the variation in sample size on account of frequency input variations, which can be substantially in the range of 42.5 Hz to 70.0 Hz, a resampling process is performed with the obtained samples. The resampling process yields 4096 samples per interval. The new 4096 sample size is used to calculate harmonic and inter-harmonic information using a well-known FFT algorithm.

Figure 2A:
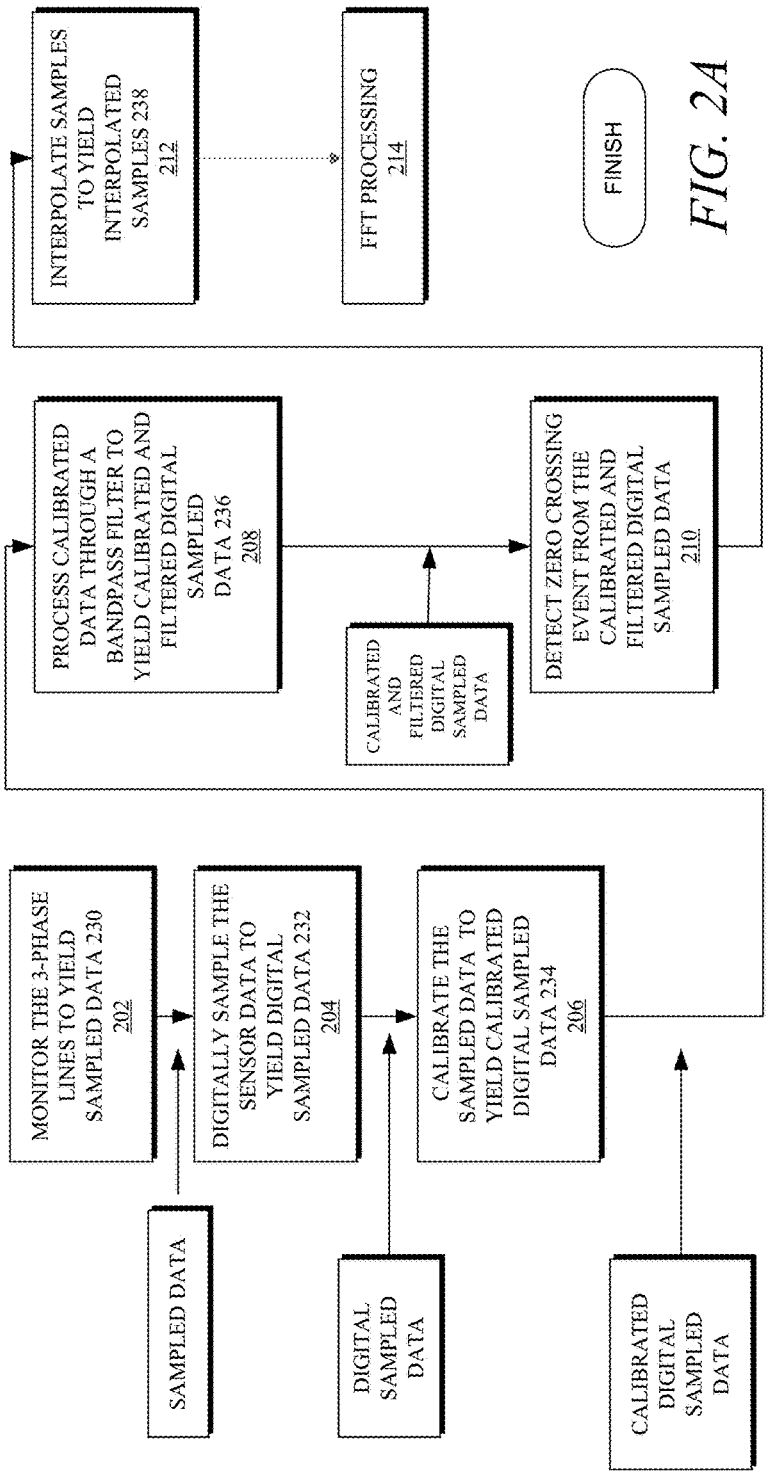
FIG. 2A is a flowchart illustrating a method for identifying harmonic and inter-harmonic information present in a power signal, according to one exemplary embodiment.
Figure 2B:
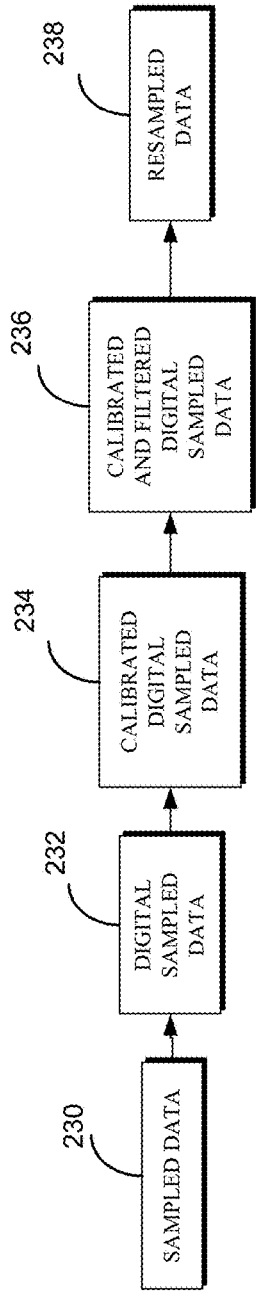
FIG. 2B is a data flow diagram of the method described in FIG. 2A.

FIG. 2A is a flowchart illustrating a method for identifying harmonic and inter-harmonic information present in a power signal, according to one exemplary embodiment. FIG. 2B is a data flow diagram of the described method.

Referring initially to FIG. 2A, at step 202, the three phase lines A, B, C of an electrical distribution system 11 is coupled to and monitored by a plurality of sensors 12, as shown in FIG. 1. The plurality of sensors 12 are shown coupled to A/D converters 14 in FIG. 1.

At step 204, the A/D converters 14 digitally sample the sensor data (line voltages and currents) to convert it from the analog domain to the digital domain yielding sampled data 232, as shown in the data flow diagram of FIG. 2B. In one embodiment, the A/D converters 14 samples the sensed line voltages and currents of 61.44 KHz yielding 1024 samples per cycle for 60 Hz fundamental input. The A/D sampling is performed under the control of firmware embedded in the FPGA 80 and DSPs 60, 70 shown in FIG. 1. In one embodiment, 12 consecutive cycles of data are collected, where each cycle includes 1024 samples per cycle for a total of 12,288 samples per interval, as shown in FIG. 4.

At step 206, a calibration is performed on the digitized sampled data 232 yielding calibrated digital sampled data 234. The calibration is optionally done in firmware, for example in FPGA 80.

At step 208, the calibrated digital sampled data 234 is processed by a filtering function implemented in DSP2 70 to yield calibrated and filtered sampled data 236.

Figure 5:
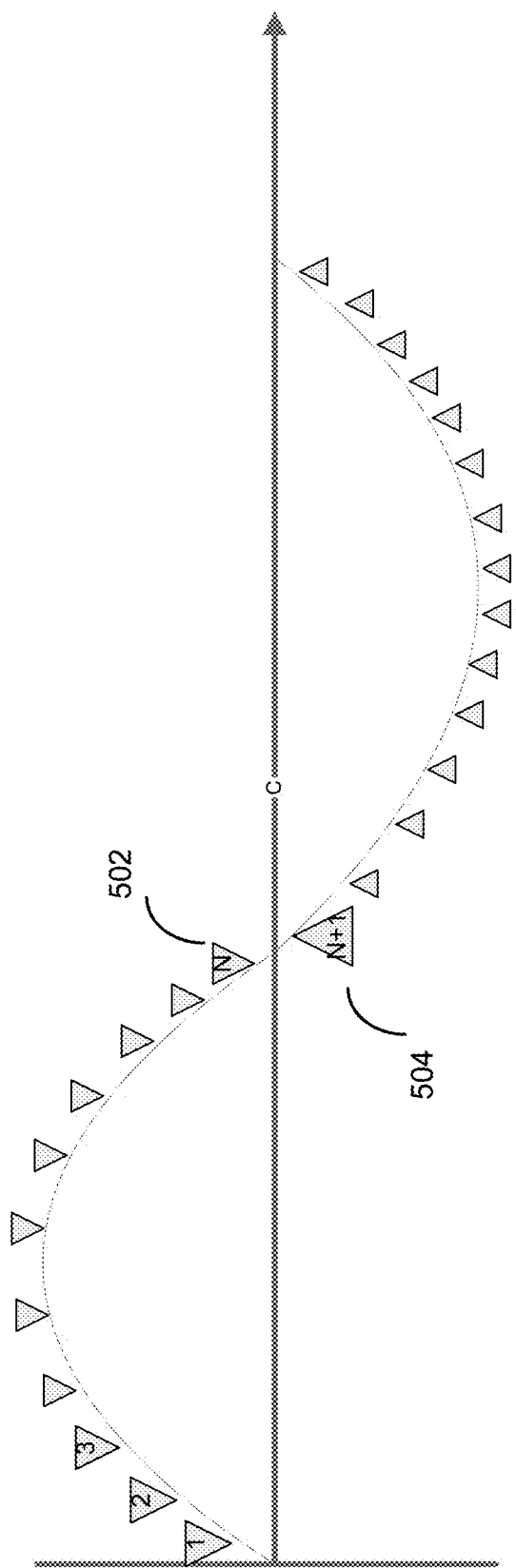
FIG. 5 illustrates a single zero-crossing event between two calibrated digital sampled data points.

At step 210, for the exemplary 60 Hz declared system setup, 24 consecutive zero-crossing events are detected on the calibrated and filtered digital sampled data 236 output from DSP2 70. FIG. 5 illustrates, by way of example, a zero-crossing event between calibrated digital sampled data point (N) 502 and calibrated digital sampled data point (N+1) 504. The positions of the 24 consecutive zero-crossing events are preferably saved in a memory.

At step 212, the calibrated digital sampled data points 234 from step 206 are stored in non-volatile memory 20 and are processed in accordance with the previously determined zero-crossing event information obtained at step 210 to construct a new set of data points. Specifically, in the exemplary embodiment, 12,288 calibrated digital sampled data points are stored in a non-volatile memory comprising 12 consecutive cycles of data which is equivalent to 1 interval of operation, as defined herein. In an embodiment, processing comprises resampling the stored data points to construct a new set of data points (i.e., resampled signals) within the range of the discrete set of known data points, as required by the FFT frequency analysis described below. Within a calculation based on a sample rate conversion, the amplitude values associated with the equidistantly distributed points in time of scanning are determined. On completion of calculation the equidistantly distributed signal comprises the digitized sample values as they would arise by analog/digital conversion within an ideal measuring device.

At step 214, a subsequent FFT frequency analysis is performed on the re-sampled calibrated digital sampled data points obtained at step 212 to obtain the frequencies present in the three phase lines A, B, C of an electrical distribution system 11. The FFT frequency analysis operates under the limitation that the sample size is a power of 2. While FFTs are not limited to powers of 2 (i.e., "radix 2") they are the most common and familiar. The "radix" is the size of an FFT decomposition. In the present application, the radix is 2. For single-radix FFTs, the transform size must be a power of the radix. In the example above, the size was 32, which is 2 to the 5th power.

Because the frequency inputs can be in the range of 42.5 Hz to 70.0 Hz, the total number of digital samples obtained in one interval can range from 10,530 to 17,350. Given that there is no assurance that total number of digital samples obtained will be a power of 2, it becomes necessary to perform a sample rate conversion comprising re-sampling the calibrated data samples 234 to construct a new set of data points having a sample size that is assured to be a power of 2 within the range of the discrete set of known data points.

The FFT operates by decomposing an N point time domain signal into N time domain signals each composed of a single point. The second step is to calculate the N frequency spectra corresponding to these N time domain signals. Lastly, the N spectra are synthesized into a single frequency spectrum.

Functionally, the FFT decomposes the set of data to be transformed into a series of smaller data sets to be transformed. Then, it decomposes those smaller sets into even smaller sets. At each stage of processing, the results of the previous stage are combined in special way. Finally, it calculates the DFT of each small data set. For example, an FFT of size 32 is broken into 2 FFTs of size 16, which are broken into 4 FFTs of size 8, which are broken into 8 FFTs of size 4, which are broken into 16 FFTs of size 2. Calculating a DFT of size 2 is trivial. This process is shown by way of example in FIG. 6.

The first stage breaks the 16 point signal into two signals each consisting of 8 points. The second stage decomposes the data into four signals of 4 points. This pattern continues until there are N signals composed of a single point. An interlaced decomposition is used each time a signal is broken in two, that is, the signal is separated into its even and odd numbered samples. There are $\text{Log}_2$ N stages required in this decomposition, i.e., a 16 point signal ($2^4$) requires 4 stages, a 512 point signal ($2^7$) requires 7 stages, a 4096 point signal ($2^{12}$) requires 12 stages. The present disclosure preferably uses a 4096 point signal ($2^{12}$) requiring 12 stages.

Figures 6, 7:
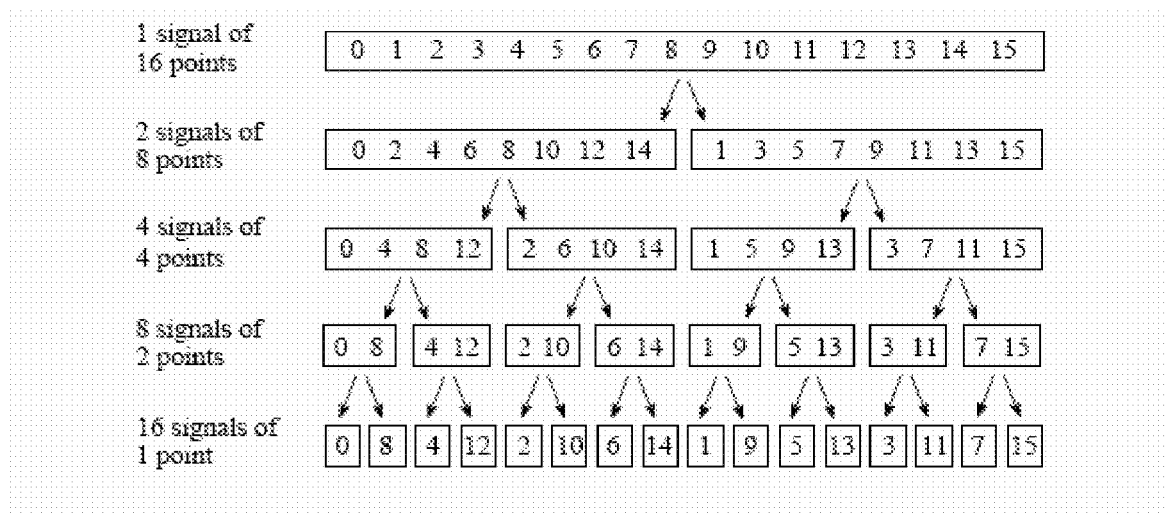
FIG. 6 illustrates an FFT decomposition in accordance with an embodiment of the present disclosure.
FIG. 7 illustrates an FFT bit reversal sorting in accordance with an embodiment of the present disclosure.

The decomposition is a reordering of the samples in the signal. FIG. 7 shows the rearrangement pattern required. On the left, the sample numbers of the original signal are listed along with their binary equivalents. On the right, the rearranged sample numbers are listed, also along with their binary equivalents. The important idea is that the binary numbers are the reversals of each other. For example, sample 3 (0011) is exchanged with sample number 12 (1100) Likewise, sample number 14 (1110) is swapped with sample number 7 (0111), and so forth. The FFT time domain decomposition is usually carried out by a bit reversal sorting algorithm. This involves rearranging the order of the N time domain samples by counting in binary with the bits flipped left-for-right (such as in the far right column in FIG. 7).

The next step in the FFT algorithm is to find the frequency spectra of the 1 point time domain signals. This step is trivial in that the frequency spectrum of a 1 point signal is equal to itself. This means that nothing is required to do this step. Although there is no work involved, it is noted that each of the 1 point signals is now a frequency spectrum, and not a time domain signal.

The last step in the FFT is to combine the N frequency spectra in the exact reverse order that the time domain decomposition took place. Unfortunately, the bit reversal shortcut is not applicable, and we must go back one stage at a time. In the first stage, 16 frequency spectra (1 point each) are synthesized into 8 frequency spectra (2 points each). In the second stage, the 8 frequency spectra (2 points each) are synthesized into 4 frequency spectra (4 points each), and so on. The last stage results in the output of the FFT, a 16 point frequency spectrum.

The FFT is preferred over performing an DFT given that the DFT takes $N^\wedge 2$ operations for N points. Since at any stage the computation required to combine smaller DFTs into larger DFTs is proportional to N, and there are log 2(N) stages (for radix 2), the total computation is proportional to N*log 2(N). Therefore, the ratio between a DFT computation and an FFT computation for the same N is proportional to N/log 2(n). In cases where N is small this ratio is not very significant, but when N becomes large, this ratio gets very large. (Every time you double N, the numerator doubles, but the denominator only increases by 1.

In another embodiment, IED 10 is configured for high precision real time synchronized frequency/phasor/zero-crossing measurement across a wide area power distribution network. As single unit, the IED 10 measures frequency/phasor/zero-crossing parameters, all of which are time-stamped with high accurate RTC (real time clock) time, either from a GPS signal or PTP (Precision Time Protocol) IEEE1588 server, the details of which are described below in reference to FIG. 8. Multiple IEDs, distributed across a wide geographic area, can communicate to each other or send measurement information to a central office which can use the available information to do further analysis.

Figure 8:
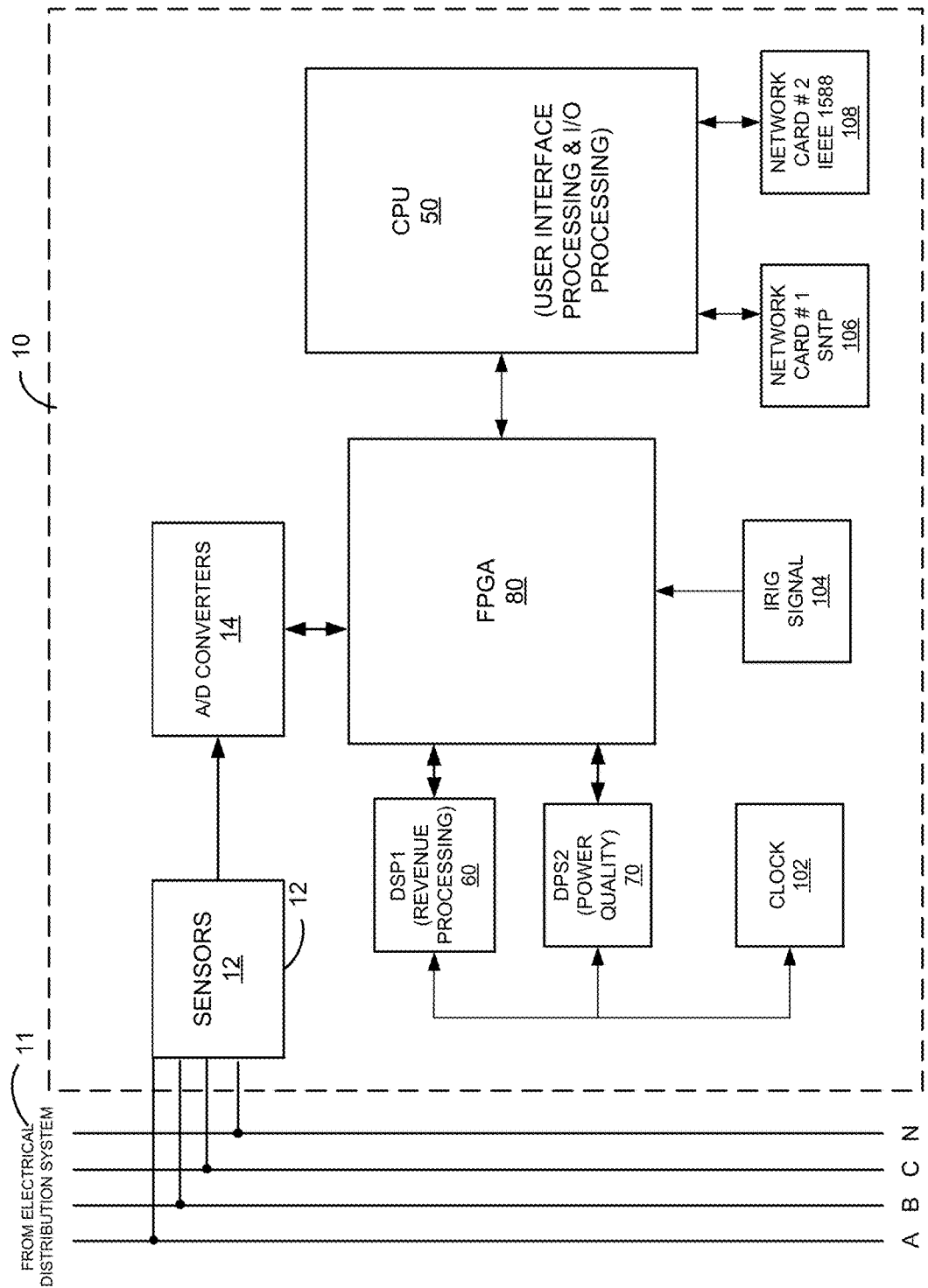
FIG. 8 is a block diagram of an intelligent electronic device (IED), according to another embodiment of the present disclosure.

Referring to FIG. 8, an IED 10 configured for high precision real time synchronized frequency/phasor/zero-crossing measurement is illustrated. It is to be appreciated clock 102 provides time to at least one DSP 60, 70, where the appropriate DSP 60, 70 using the time to timestamp data, for example, measured values received from the FPGA 80, calculated parameters, etc. However, the clock 102 may need to be periodically updated or set due to drift or other factors affecting the performance of the clock 102. The clock 102 may be set by an Inter-Range Instrumentation Group (IRIG) signal or a signal received over a network. The received time signal is then used by the at least one DSP 60, 70 to set clock 102.

In one embodiment, a TRIG signal 104 provides a time signal to the FPGA 80. Upon providing the time signal to the FPGA 80, the FPGA 80 starts an internal counter which is used to determine a skew in time or difference between when the FPGA 80 receives the time signal and the point in time when the at least one DSP 60, 70 accesses the FPGA 80 to retrieve the time. The at least one DSP 60, 70 determines this differential via the internal counter which is used with the originally received time signal to accurately determine the time and transmit it to the clock 102.

In another embodiment, the time signal is received at the IED over a network, via a network card 106, 108. In one embodiment, network card 106 receives a time signal from a SNTP (Simple Network Time Protocol) server. In this embodiment, the network card 106 provides a time signal to the CPU 50, which passes the time signal to the FPGA 80 along with a signal to reset the internal counter of the at least one DSP 60, 70. As above, the internal counter is used to determine a skew in time or difference between when the FPGA 80 receives the time signal and the point in time when the at least one DSP 60, 70 accesses the FPGA 80 to retrieve the time. The FPGA 80 determines this differential via the internal counter which is used with the originally received time signal to accurately determine the time and transmit it to the clock 102.

In another embodiment, the time signal is received at the IED over a network, via a network card 106, 108. In one embodiment, network card 108 receives a time signal from a PTP IEEE 1588 server. The Precision Time Protocol (PTP) is a protocol used to synchronize clocks throughout a computer network; on a local area network it achieves clock accuracy in the sub-microsecond range. In this embodiment, the network card 108 provides a time signal to the CPU 50, which passes the time signal to the FPGA 80. Here, the network card 108 sends a signal to reset the internal counter of the FPGA 80. As above, the internal counter is used to determine a skew in time or difference between when the FPGA 80 receives the time signal and the point in time when the at least one DSP 60, 70 accesses the FPGA 80 to retrieve the time. The at least one DSP 60, 70 determines this differential via the internal counter which is used with the originally received time signal to accurately determine the time and transmits it to the clock 102.

In a further embodiment, the time differential between the FPGA 80 and the at least one DSP 60, 70 is achieved by providing a counter in each of the FPGA 80 and the at least one DSP 60, 70 which are synchronized to each other. When a timing signal is received by the FPGA 80, the FPGA 80 latches its counter. When the at least one DSP 60,70 attempts to retrieve the timing signal from the FPGA 80, the at least one DSP 60, 70 determines the differential based on the difference between its internal counter and the latched counter of the FPGA 80. Based on the determined differential and the received timing signal, the at least one DSP 60, 70 accurately determines the time and transmits it to the clock 102.

Although the IED 10 may employ one method or device to set the time, it is to be appreciated that the three above-described methods and devices may all be used in one IED 10 as a redundant time system. When all three methods are employed, each method may be given a priority so the IED can select the method with the highest priority from the methods or devices available. For example, the IED 10 may select the network card 108 employing time signals received from a IEEE 1588 server over a network. Upon a network failure, the IED 10 may switch to the TRIG signal since this signal is not dependent on the network.

In another embodiment, the IED 10 is configured in a SPI (Serial Peripheral Interface) multimaster implementation. Conventionally, a SPI bus can only have one component acting as a master device at one time. For example, at startup of the IED 10, the CPU 50 will be a master device on the SPI bus to transfer data, e.g., executable instructions, to at least one of the DSPs 60, 70. Once the at least one DSP 60, 70 receives the code, the DSP 60, 70 will need to take control of the SPI bus and therefore, will need to become the master device of the SPI bus.

Figure 9:
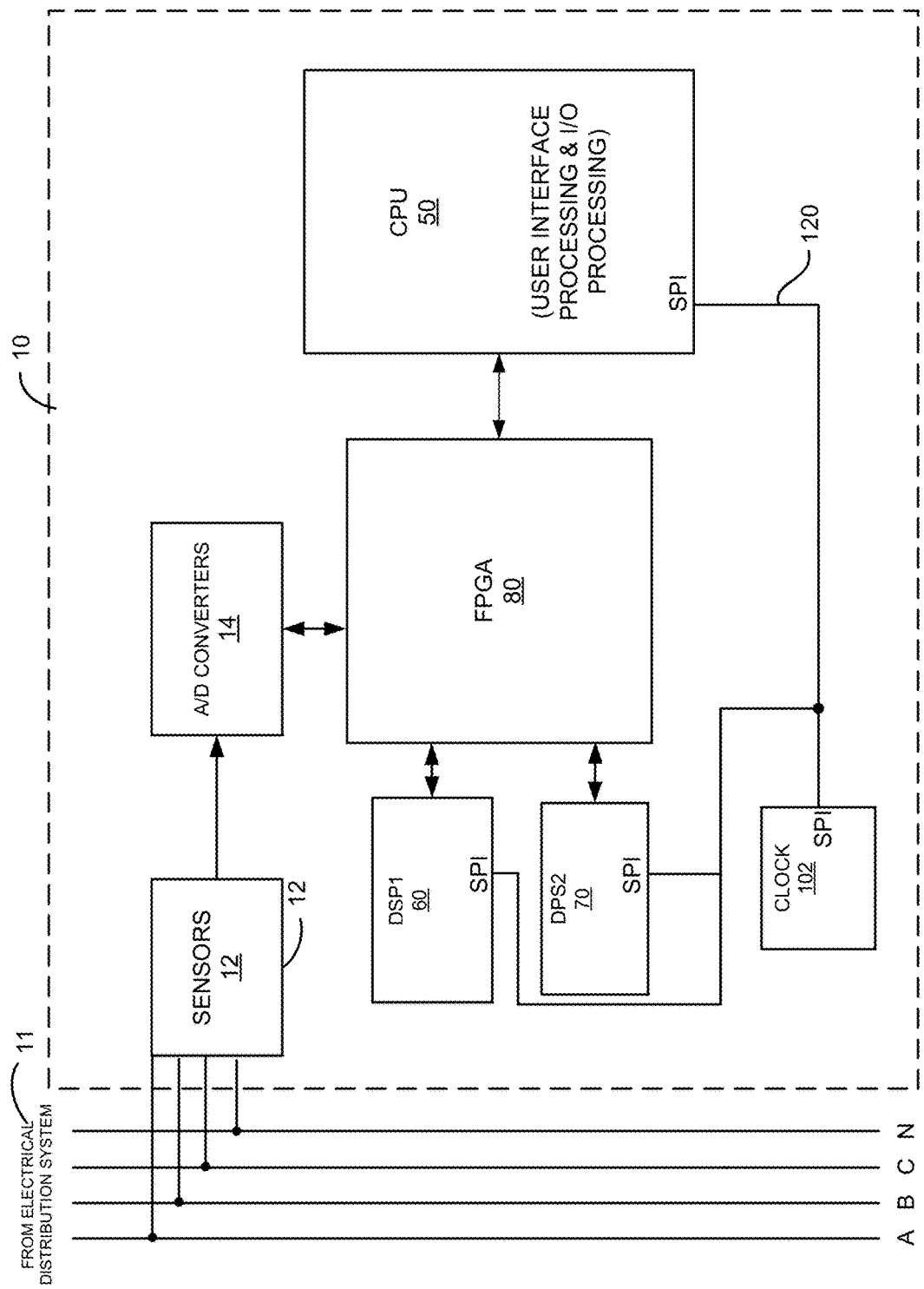
FIG. 9 is a block diagram of an intelligent electronic device (IED), according to a further embodiment of the present disclosure.

The IED 10 of the present disclosure is configured to enable devices to become a master and slave at different time to control the SPI bus. Referring to FIG. 9, SPI bus 120 is routed to at least CPU 50, DSP 60, DSP 70 and clock 102. Upon startup of the IED 10, the CPU 50 will be the master device and transmit code to the at least one DSP 60,70. Once it receives the code, the DSP 60, 70 will need to be the master device. In one implementation, the FPGA 80 includes at least one semaphore register which enables the components to determine the master device among themselves. Alternatively, the FPGA 80 acts as the arbiter for determining which device is the master device based on requests from other components.

In another embodiment, the IED 10 is configured for power factor averaging using complex numbers. In metering measurement environments, power factors are typically represented by a positive number of (1~4), (0~1) represent power factor in quadrant4, (270~360 degree as phasor);
(1~2) represent power factor in quadrant1, (0~90 degree as phasor);
(2~3) represent power factor in quadrant2, (90~180 degree as phasor);
(3~4) represent power factor in quadrant3, (180~270 degree as phasor);
But the value cannot be used to calculate average mathematically, because at the boundary of 4 to 0, it's not continuous in math, for example, to compute average from a set of value, 0.1, 3.9, 0.1, 3.9, the average is (0.1+3.9+0.1+3.9)/2=2, which is not correct. One way to derive the correct value efficiently is to convert the power factor into a complex number with following equation, and then average the complex number. First, convert PF into complex number in polar form, modulus=1, argument=360*(PF/4)=PF*90; then convert the polar form into vector form, as follows:

$$\cos(PF*90))+i\sin(PF*90)<\text{---}> \quad \text{equation \#1.}$$

One example is average five 0.2 sec PF instantaneous readings into 1 sec average PF reading, where the 0.2 sec readings are, 3.95, 0.03, 0.04, 3.97, 3.99. With straight average (3.95+0.03+0.04+3.97+3.99)/5=2.396, it's an incorrect average readings. Instead, converting PF into complex number with equation #1

$$3.95<\text{---}>(0.996917333)+i(-0.078459103)$$

$$0.03<\text{---}>(0.998889875)+i(0.047106451)$$

$$0.04<\text{---}>(0.998026728)+i(0.062790519)$$

$$3.97<\text{---}>(0.998889875)+i(-0.047106458)$$

$$3.99<\text{---}>(0.999876632)+i(-0.015707324)$$

The average of complex number is (0.998520089)+i(−0.006275183), first convert this number into polar form, it's argument is 359.1, here we don't really care about the modulus, convert into PF, just need to divide to 90, which is (360/4), so 1 sec average PF=359.64/90=3.996. A similar algorithm can be used to calculate average phase angle.

In a further embodiment, the IED 10 is configured for transfer of data between processors with different bit/byte order without adding additional processing overhead. In this embodiment, internal communication between CPU 50 (e.g., big endian machine) and DSP 60,70 (e.g., little endian machine), when passing numerical binary data, data format conversion is done through parallel->serialization->parallel transmission without any software/firmware/CPU cycle overhead. In an exemplary embodiment, the sequence is, 1st, transmit side setup 2 byte word with receive side endian mode sequence; 2nd, transmit side sending data buffer from one end, such as from high address side; 3rd, receive side fill buffer from the other end, such as from low address side; 4nd, receive side define data structure backward as transmit side, different data passing correctly.

Assume, a block of 16 byte memory, small endian side CPU is the source, big endian side CPU is the destination. On small endian side CPU, data structure defined as {uint16 a; uint16 b; uint32 c; uint64 d;} when a=0x0100; b=0x0302; c=0x07060504; d=0x0F0E0D0C0B0A0908; memory inside the small endian CPU looks like as following: 0x00 0x01 0x02 0x03 0x04 0x05 0x06 0x07 0x08 0x09 0x0A 0x0B 0x0C 0x0D 0x0E 0x0F, memory copy #1. When these piece of memory copied into big endian CPU's memory, either through a shared memory (e.g., a dual port ram) or transfer through a serial link, hardware can take care of the bit swapping between the two endian data format without any software/firmware/CPU cycle's load. For example, when transfer than serial link, the hardware can be configured to send least significant bit firstly or most significant bit firstly, with shared memory (e.g., dual port ram), physical pin order would be swapped as

D7_RAM<--->D0_CPU

D6_RAM<--->D1_CPU

D5_RAM<--->D2_CPU

D4_RAM<--->D3_CPU

D3_RAM<--->D4_CPU

D2_RAM<--->D5_CPU

D1_RAM<--->D6_CPU

D0_RAM<--->D7_CPU

This swapping can done with physical PCB layout or a programmable logic (FPGA), as long as it's implemented with hardware, it will not require any software/firmware/CPU cycle loads.

Inside in big endian CPU's memory, the same data structure {uint16 a; uint16 b; uint32 c; uint64 d;} would be save as follows: 0x01 0x00 0x03 0x02 0x07 0x06 0x05 0x04 0x0F 0x0E 0x0D 0x0C 0x0B 0x0A 0x09 0x08, memory copy#2. It would take considerable loads for software/firmware/CPU cycles to do these byte order swapping to convert memory copy#1 into copy#2, even the hardware take care of the bit swapping within byte boundary. But once inside big endian CPU side, if we define the data structure with backward ordering as the other end, {uint64 d; uint32 c; uint16 b; uint16 a; inside big endian CPU side, the memory would be saved follows: 0x0F 0x0E 0x0D 0x0C 0x0B 0x0A 0x09 0x08 0x07 0x06 0x05 0x04 0x03 0x02 0x01 0x00, memory copy#3. To get memory copy#3 from memory copy#1, the transfer order needs to be setup backward either on transmit side or receive side, for example, via the CPU's DMA engine, and it will not require any software/firmware/CPU cycle loads.

While preferred embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. A digital power meter comprising:
   at least one sensor that senses analog electrical parameters on electricity transmission lines from an electrical power distribution system;
   at least one analog-to-digital converter that receives the analog electrical parameters from the at least one sensor and converts the analog electrical parameters to sampled data;
   at least one digital signal processing (DSP) device that performs calculations to determine power usage based on the sampled data;
   a central processing unit (CPU) coupled to the at least one DSP by a serial peripheral interface (SPI) bus,
   wherein upon startup of the meter, the CPU is a master device on the SPI bus and the at least one DSP is a slave device; and
   a field programmable gate array (FPGA) that acts as an arbiter to determine which component of the meter is the master device based on requests from other components after startup of the meter.

2. The meter of claim 1, wherein the CPU is further configured to transfer executable instructions to the at least one DSP and, upon receiving the executable instructions, the at least one DSP becomes the master device and the CPU becomes the slave device.

3. The meter of claim 1, wherein the sensed analog electrical parameters include at least one of voltages and currents.

4. The meter of claim 1, wherein the at least one processing device receives a time signal.

5. The meter of claim 4, wherein the time signal is an Inter-Range Instrumentation Group (IRIG) time signal.

6. The meter of claim 4, wherein the time signal is received from one of a Simple Network Time Protocol (SNTP) server and a Precision Time Protocol (PTP) server.

7. The meter of claim 4, wherein the at least one processing determines a clock skew value.

8. The meter of claim 4, wherein the at least one processing device resets an internal counter in response to receiving the time signal.

9. The meter of claim 1, wherein the at least one processing device calculates an average power factor value of the analog electrical parameters.

10. The meter of claim 9, wherein the at least one processing device calculates the average power factor value by converting power factor values into complex numbers in polar form and converting the polar form into vector form.

11. The meter of claim 1, wherein the at least one processing device comprises a plurality of processing devices having different bit or byte order, wherein a transfer of data from one processing device of the plurality of processing devices to another is executed without additional processing overhead.

12. The meter of claim 11, wherein when a first processing device is a big endian device and a second processing device is a little endian device and data format conversion is executed through a parallel-serialization-parallel process.

13. The meter of claim 1, wherein the at least one DSP is configured to perform at least one of revenue calculations and/or waveform and transient analysis.

14. The meter of claim 1, wherein the at least one sensor, at least one analog-to-digital converter, at least one DSP, CPU, SPI and FPGA are disposed in a housing, the housing configured as at least one of a panel meter housing and a socket meter housing.

15. The meter of claim 14, further comprising a touch screen display that displays at least one of the sampled data and/or determined power usage.

16. The meter of claim 15, further comprising a communication device that transmits at least one of the sampled data and/or determined power usage to another device, the communication device operating under at least one of a hardwired transmission protocol and/or a wireless transmission protocol.

17. A digital power meter comprising:
at least one sensor that senses analog electrical parameters on electricity transmission lines from an electrical power distribution system;
at least one analog-to-digital converter that receives the analog electrical parameters from the at least one sensor and converts the analog electrical parameters to sampled data;
at least one processing device that performs calculations to determine power usage based on the sampled data and control overall operation of the meter;
a Serial Peripheral Interface (SPI), wherein the at least one processing device includes a plurality of processing devices, the SPI allowing one of the plurality of processing devices to become a master and the other processing devices of the plurality of processing devices to become slaves; and
a field programmable gate array (FPGA) that acts as an arbiter to determine which processing device of the plurality of processing devices is the master device based on requests from other processing devices.

18. The meter of claim 14, wherein at least one first processing device is further configured to transfer executable instructions to at least one second processing device and, upon receiving the executable instructions, the at least one second processing device becomes the master device and the at least one first processing device becomes the slave device.

19. The meter of claim 17, wherein the at least one sensor, at least one analog-to-digital converter, at least one processing device, SPI and FPGA are disposed in a housing, the housing configured as at least one of a panel meter housing and a socket meter housing.

20. The meter of claim 19, further comprising a touch screen display that displays at least one of the sampled data and/or determined power usage.

21. The meter of claim 20, further comprising a communication device that transmits at least one of the sampled data and/or determined power usage to another device, the communication device operating under at least one of a hardwired transmission protocol and/or a wireless transmission protocol.

22. A digital power meter comprising:
at least one sensor that senses analog electrical parameters on electricity transmission lines from an electrical power distribution system;
at least one analog-to-digital converter that receives the analog electrical parameters from the at least one sensor and converts the analog electrical parameters to sampled data;
at least one processing device that performs calculations to determine power usage based on the sampled data and control overall operation of the meter;
a Serial Peripheral Interface (SPI), wherein the at least one processing device includes a plurality of processing devices, the SPI allowing one of the plurality of processing devices to become a master and the other processing devices of the plurality of processing devices to become slaves; and
a field programmable gate array (FPGA) including a semaphore register that enable at least one processing device on the SPI bus to determine a master device among the plurality of processing devices.

23. A digital power meter comprising:
at least one sensor that senses analog electrical parameters on electricity transmission lines from an electrical power distribution system;
at least one analog-to-digital converter that receives the analog electrical parameters from the at least one sensor and converts the analog electrical parameters to sampled data;
at least one digital signal processing (DSP) device that performs calculations to determine power usage based on the sampled data;
a central processing unit (CPU) coupled to the at least one DSP by a serial peripheral interface (SPI) bus,
wherein upon startup of the meter, the CPU is a master device on the SPI bus and the at least one DSP is a slave device; and
a field programmable gate array (FPGA) including a semaphore register that enable components on the SPI bus to determine a master device among the components after startup of the meter.

24. A digital power meter comprising:
at least one sensor that senses analog electrical parameters on electricity transmission lines from an electrical power distribution system;
at least one analog-to-digital converter that receives the analog electrical parameters from the at least one sensor and converts the analog electrical parameters to sampled data;
at least one digital signal processing (DSP) device that performs calculations to determine power usage based on the sampled data;
a central processing unit (CPU) coupled to the at least one DSP by a serial peripheral interface (SPI) bus,
wherein upon startup of the meter, the CPU is a master device on the SPI bus and the at least one DSP is a slave device; and
a field programmable gate array (FPGA) that acts as an arbiter to determine which of the at least one DSP and CPU is the master device based on requests from the at least one DSP and CPU after startup of the meter.

* * * * *